United States Patent [19]

Ikeya

[11] Patent Number: 5,688,128

[45] Date of Patent: Nov. 18, 1997

[54] DETACHABLE SOCKET FOR AN IC CHIP

[75] Inventor: Kiyokazu Ikeya, Shizuoka, Japan

[73] Assignee: Texas Instruments Incorporated, Dallas, Tex.

[21] Appl. No.: 367,962

[22] Filed: Jan. 3, 1995

[30] Foreign Application Priority Data

Jan. 10, 1994 [JP] Japan .................................. 6-012213

[51] Int. Cl.$^6$ ...................................................... H01R 9/09
[52] U.S. Cl. ...................................... 439/73; 439/72
[58] Field of Search ................... 439/73, 71, 72, 439/377, 525

[56] References Cited

U.S. PATENT DOCUMENTS

| | | | |
|---|---|---|---|
| 4,758,176 | 7/1988 | Abe et al. | 439/72 |
| 4,986,760 | 1/1991 | Petersen et al. | 439/71 |
| 5,076,798 | 12/1991 | Uratsuji | 439/73 |
| 5,099,393 | 3/1992 | Bentlage et al. | 439/73 |
| 5,120,238 | 6/1992 | Marks et al. | 439/73 |
| 5,199,883 | 4/1993 | Uratsuji | 439/72 |
| 5,244,404 | 9/1993 | Kishi et al. | 439/72 |
| 5,266,037 | 11/1993 | Hertzel et al. | 439/72 |
| 5,276,961 | 1/1994 | Matta et al. | 29/827 |
| 5,321,583 | 6/1994 | McMahon | 439/91 |
| 5,326,271 | 7/1994 | Kishi et al. | 439/72 |
| 5,356,298 | 10/1994 | Voss et al. | 439/91 |
| 5,395,255 | 3/1995 | Kato | 439/72 |

*Primary Examiner*—J. J. Swann
*Attorney, Agent, or Firm*—Russell E. Baumann; Richard L. Donaldson; René E. Grossman

[57] ABSTRACT

A socket for mounting an electrical part such as an IC chip 60 in a freely detachable manner in which the electrical part 60 has a plurality of connective terminal parts of a prescribed pitch, has socket terminals 50 fixed in the socket 10 and a plurality of electroconductive parts 34 positioned on an insulating substrate 32. Each of the electroconductive parts 34 has first and second contact areas (34a, 34b) areas with the first contact area 34a having the same pitch as the pitch between the connective terminal parts BP. The insulating substrate 32 is held by a spring biased support member to provide for reliable contacting with the electrical part 60. The first contact area 34a of the electroconductive parts 34 provides electrical connection with one of the connective terminal parts BP of the electrical part 60 and the second contact part 34b provides electrical connection with one of the socket terminals 50 thereby providing reliable electrical connections between the electrical part 60 and the socket. This design provides for electrical connection for electrical parts without external lead terminals.

18 Claims, 7 Drawing Sheets

DETACHABLE SOCKET FOR AN IC CHIP

FIELD OF THE INVENTION

This invention relates to sockets for the mounting of electrical parts such as an integrated circuit element or the like in a freely detachable manner to thereby obtain an electrical connection with the electrical parts.

BACKGROUND OF THE INVENTION

In the production of semiconductor parts, it is common to form an IC (integrated circuit) package by resin sealing a semiconductor integrated circuit chip (IC chip). Such IC chips/IC packages are subjected to a reliability test called "burn in" prior to final shipment for operational use. The "burn in" test is a functional test subjecting the chip to a temperature and voltage condition for the purpose of separating the good product from the bad product.

The construction of a typical prior art socket which is employed for mounting the IC packages in such a burn-in test is shown in FIGS. 11 and 12. FIG. 11 is an oblique view of a socket according to prior art and FIG. 12 is a partial cross sectional side view of the same.

This socket comprises a base 100 as a main socket body to be fixed on a substrate (which is not shown in the drawing), and a cover 102 which has been installed in such a manner as to be opened or closed by a hinge means against the upper surface of this base 100. On one side of the base 100, there is installed a hinge 104 which is equipped with a coil spring 103 and a movable plate piece 106 of this hinge 104 is integrally formed on said one side of the cover 102, so that the cover 102 may revolve in a direction indicated by an arrow mark J with the rotary shaft 108 of the hinge 104 as the center.

On the opposite side of the cover 102, a rotary shaft 120 is journaled and a latch 122 for holding the cover 102 in a fixed closed state on the base 100 is provided on this rotary shaft 120. A hook part 122a of this latch 122 is adapted to be in engagement in the closed state with a concave part 100a on the opposing side of the base 100. A lever 124 formed integrally with the latch 122 extends in an opposite direction, and as this lever 124 is rotated in opposition to a coil spring 126, the latch 122 moves out of engagement with concave part 100a to an unlatched position.

The upper surface of the base 100 is so formed as to be able to mount an IC package 130 of, for example, the QFP (Quad in line Flat Package) type at the IC package mounting position 105 at the center of the base part. On the upper surface of the base 100, four guides 132, 134, 136 and 138 are erected in close proximity to the four corners of the IC package mounting site. Two side faces inside the pair of guides 132, 136 which face each other on a diagonal line are tilted surfaces forming tapered grooves 132a and 136a (only groove 132a is shown) which expand towards the bottom of the base. These grooves 132a and 136a guide the angular part of the IC package 130 when it is mounted on the socket.

On the upper surface of the base 100, a large number of contacts 140 corresponding to the lead terminal row on each side of the IC package 130 are arranged in rows on the outside of the IC package between the two adjacent guides (132, 134), (134, 136), (136, 138) and (138, 132). Between the adjacent contacts 140, a partition wall 141 is erected for the purpose of preventing the contacts themselves from contacting each other.

Each contact 140 is typically made by perforating a thin beryllium copper sheet or the like. The contact comprises a fixed part 140a which is secured to the base 100, an arc spring part 140b which extends upward in a curve from the top of fixed part 140a, a linear spring part 140c which extends like a straight line in a direction which is approximately parallel to fixed part 140a from the top of this arc spring part 140b, a contact part 140d which extends upward approximately at a right angle from the tip of the linear spring part 140c, and a socket terminal pin 140e that sticks out of the bottom side of the base 100 by extending perpendicularly downward from the bottom of the fixed part 140a.

When the IC package 130 is set at the IC package mounting site as it is guided by the grooves 132a and 136a, the tip part of each lead 130a of the IC package 130 is placed on the contact part 140d of each contact. In this state, when the cover 102 is closed, a protuberant-like compressive member 105 that has been formed on four sides on the inner surface of the cover 102 covers the tip of the leads 130a of the IC package 130, with a consequence that the IC package 130 is pressed downward in opposition to the spring force of the spring parts 140b and 140c of the contact 140. As a result of this, the tip of the lead 130a sinks perpendicularly downward integrally with the contact part 140d of the contact 140 so that the linear spring part 140c of the contact 140 is displaced downward and there is obtained an electrical connection of a prescribed pressure contact between the lead 130a and the contact 140.

In the socket according to prior art as described above, contacts 140 whose number is the same as the number of the leads 130a of the IC package 130 have to be arranged at the prescribed locations inside the base 100 which conform to the leads 130a. Because of this fact, variations in alignment of the leads can cause assembly problems. Additionally, in view of the fact that each contact 140 is displaced during the insertion of the IC package, a certain amount of clearance is required. As the pitch between the leads on the side of the IC package 130 becomes narrower, it becomes much more difficult, if not impossible, to practically design a socket with such small tolerances.

Still further, there has been an inconvenience in that the socket according to the prior art as described above cannot deal with an electric part which does not have an external lead terminal like the lead 130a such as, for example, an IC chip prior to resin-sealing.

SUMMARY OF THE INVENTION

Accordingly, it is an object of this invention in providing a socket which can be easily assembled, which can cope with the increasing trend toward the use of a larger number of lead pins; and thus, a narrower pitch between pins in electric parts, and which can cope with such electric parts that have no external lead terminals.

The socket according to this invention is used for mounting an electrical part in a freely detachable manner in which the electrical part has a body portion with a plurality of connective terminal parts with a prescribed pitch between the parts comprising a main socket body for receiving the electrical part, a socket terminal means fixed in the socket body which is stationary during mounting and dismounting of the electrical part, and a plurality of electroconductive parts on an insulative substrate mounted on a spring biased support means in the socket body, each of the electroconductive parts having first and second contact means with said first contact means of said electroconductive parts having the same pitch as the pitch between said connective terminal parts, the first contact means for electrically connecting with one of the connective terminals leads of the electrical part and the second contact means for electrically connecting with the socket terminal means thereby providing electrical connection between the electrical part and the socket.

Further, in accordance to a socket of this invention, the spring biased support means comprises an inner base, an intermediate support plate and an elastic plate contained in part within the intermediate support plate in which spring means is provided between the inner base and the intermediate support plate.

DESCRIPTION OF THE DRAWINGS

Other objects, advantages and details of this invention appear in the following detailed description of the preferred embodiments of the invention, the detailed description referring to the drawings in which.

DETAILED DESCRIPTION OF THE PREFERRED EMBODIMENTS

A first embodiment of this invention will be explained below by referring to FIGS. 1 through 9.

Figure 1:
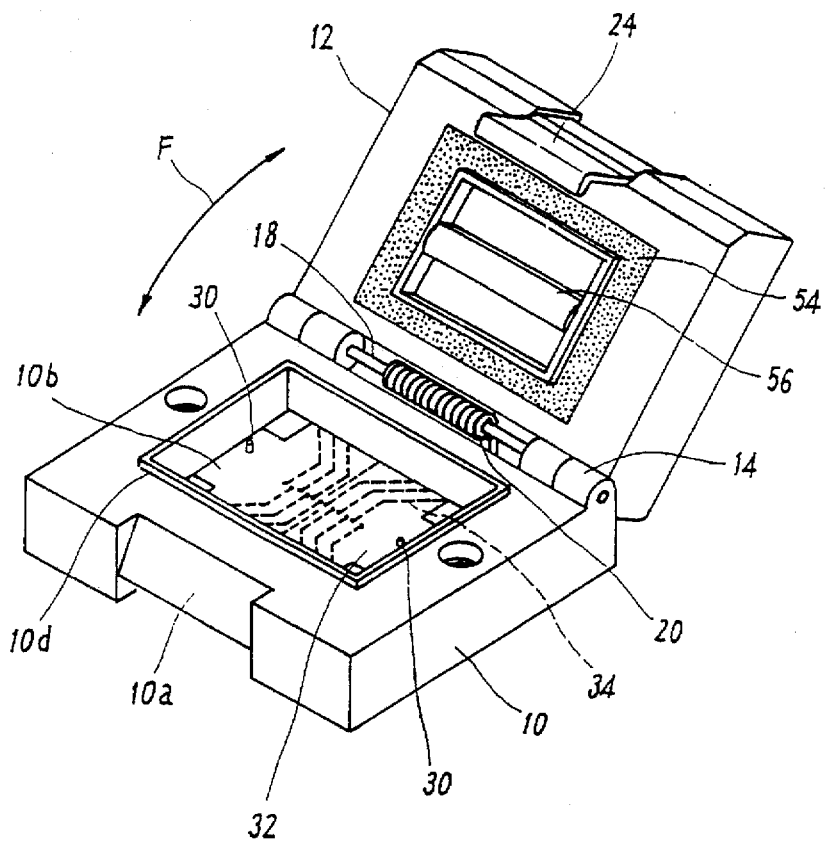
FIG. 1 is an oblique view showing the entire construction of a socket for IC chip mounting according to a first embodiment of this invention.
Figure 2:
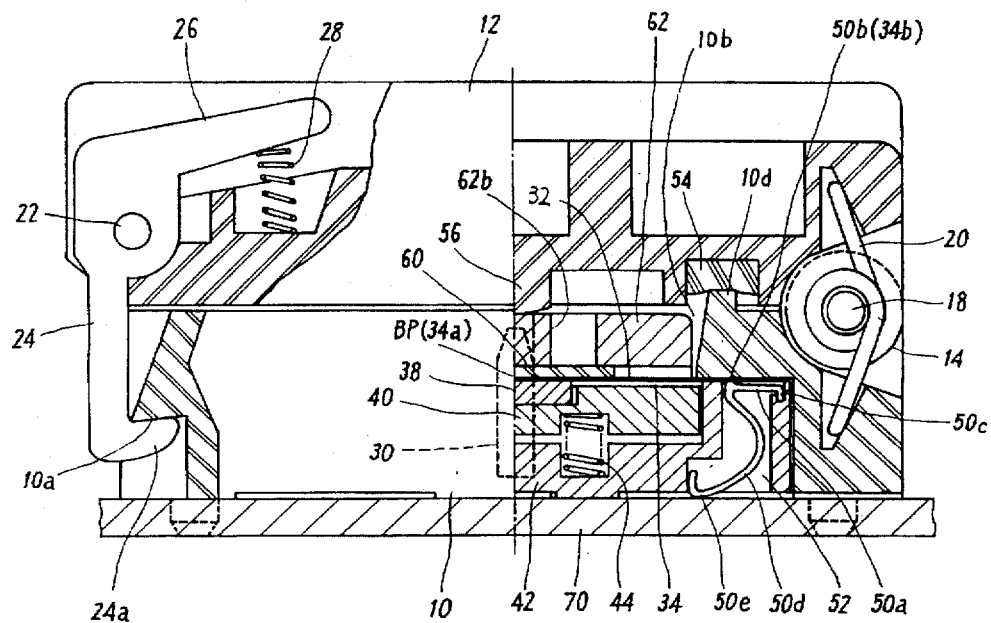
FIG. 2 is a partial cross-sectional view of the socket of FIG. 1 with the cover closed.

FIGS. 1 and 2 are an oblique view and a partial cross-sectional view of the entire construction of a socket of this invention.

The socket described in this embodiment has an external base 10 as a main socket body that is fixed onto a print substrate 70, and a cover 12 that is installed in such a manner as to be opened or closed with a hinge with regard to the upper surface of this external base 10. That is, on one side of the external base 10, the base part and the cover 12 are joined through a hinge 14 so that the cover 12 may be able to revolve in a direction shown by an arrow mark F with the rotary shaft 18 of the hinge 14 as the center. On the rotary shaft 18, there is installed a coil spring 20 for biasing the cover 12 toward the open state.

A rotary shaft 22 is journaled at the tip of the cover 12, and on this rotary shaft 22 a latch 24 is installed for holding the cover 12 in the state of covering the external base 10. A hook part 24a of this latch 24 is provided on the side of base 10 opposite to hinge 14 for engagement with a step-like concave cavity 10a when the cover 12 is closed against the upper surface of the external base 10.

A lever 26 extends in a direction which is opposite to the latch 24 and is formed integrally with latch 24. As this lever 26 is revolved in a direction in opposition to a compressive coil spring 28 that has been provided on the upper surface of the cover 12, the latch 24 is allowed to disengage from the concave cavity 10a in the external base 10 and the cover 12 opens.

Figure 7:
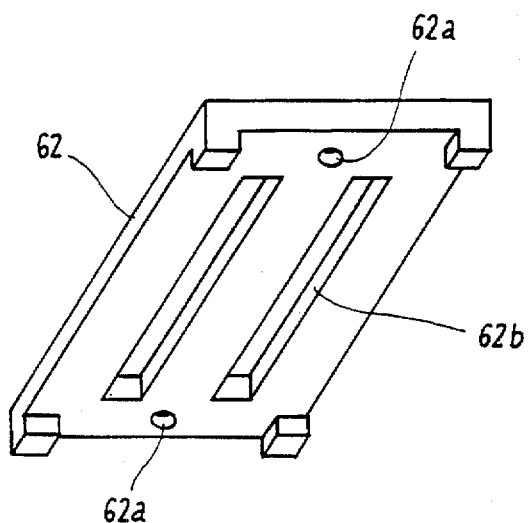
FIG. 7 is an oblique view showing the construction of the IC chip and carrier to be mounted in the socket of FIG. 1.
Figure 7:
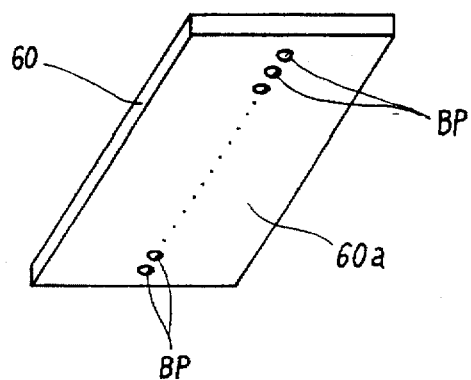

In accordance with this invention, on the upper surface of the external base 10, a central cavity 10b is provided for mounting a prescribed electric part having no external lead terminal such as an IC chip 60 prior to resin-sealing as is shown in FIG. 7.

As is shown in FIG. 7, a plurality of bumps BP (connective terminal parts) are provided on one side 60a of the IC chip 60 in a prescribed pattern of arrangement such as a single vertical row at the chip center. The IC chip 60 is mounted in the concave cavity 10b of the external base 10 with the side bearing the bumps BP (mounting side 60a) facing down toward the bottom of the cavity.

In this embodiment, a plurality such as a pair of positioning pins 30 are provided at the bottom of the cavity 10b so as to help in easily positioning the IC chip 60 inside the cavity 10b. This is typically done with a carrier 62 having pin holes 62a which conform to positioning pins 30. The IC chip 60 is held in carrier 62 by such means as an adhesive or the like and both carrier 62 and IC chip 60 are integrally mounted in the cavity 10b of the base 10.

As is shown in FIG. 1, a flat insulating film 32 made of polyimide or the like is positioned adjacent the floor or bottom of cavity 10b so as to receive the mounting surface 60a of the IC chip 60. On this insulating film 32, a plurality of electroconductive films (parts) 34 whose number is the same as the number of the bumps BP of IC chip 60 are provided in an electroconductive pattern. These electroconductive films 34 are made of a copper foil, for instance, which can be formed on the insulating film 32 by etching and form a wiring pattern.

Figure 4:
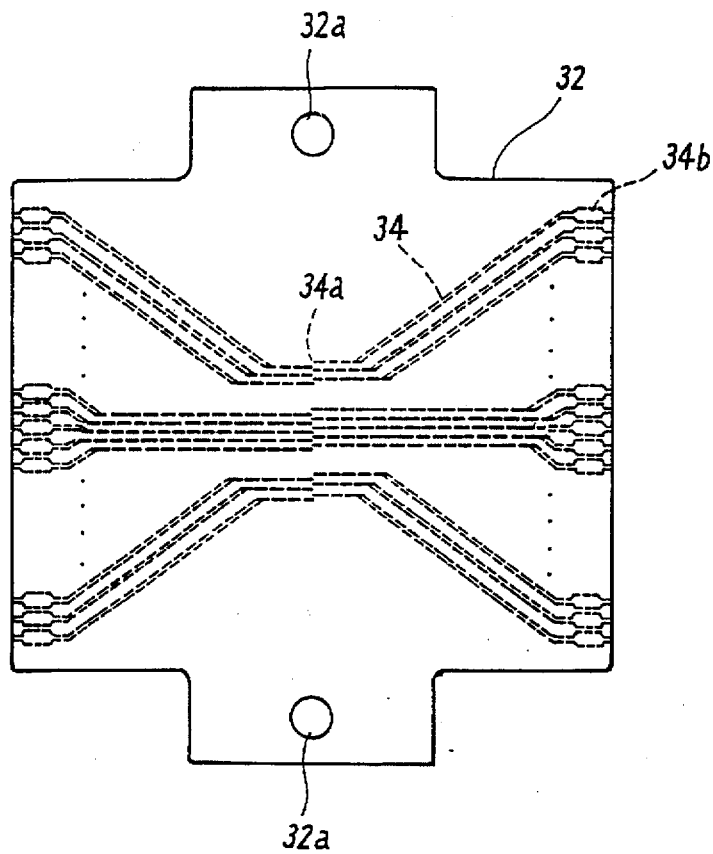
FIG. 4 is a plane figure showing the arrangement pattern of the electroconductive part in the socket of FIG. 1.
Figure 5:
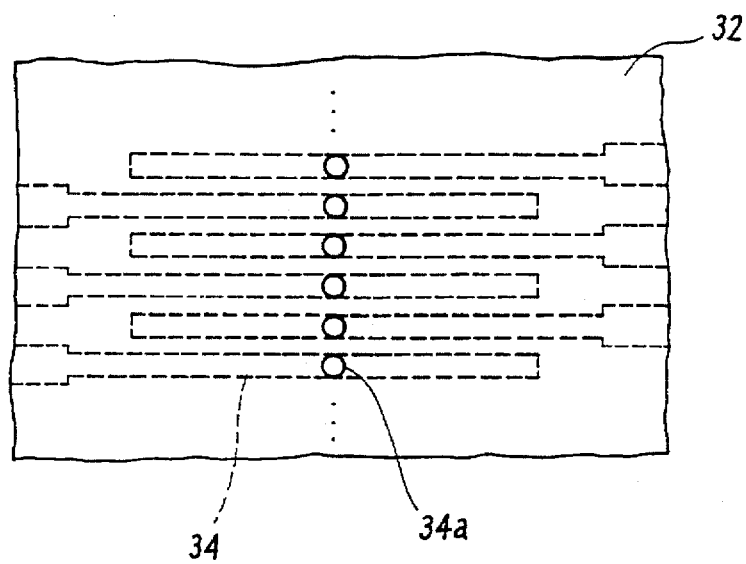
FIG. 5 is a partial expanded view of a wiring pattern.
Figure 6:
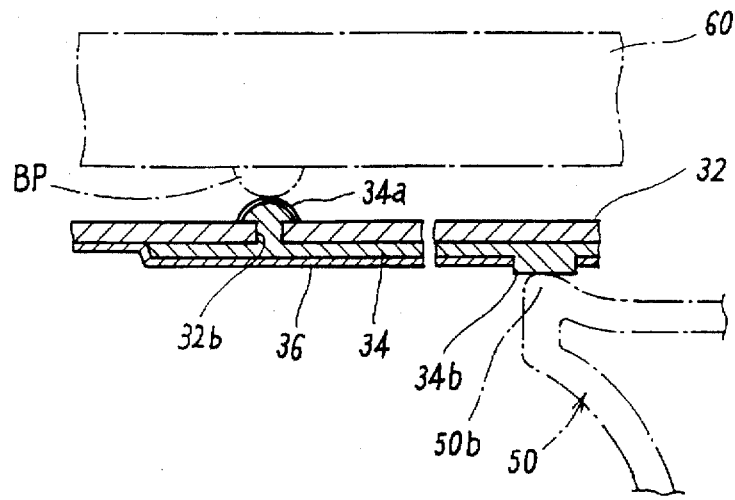
FIG. 6 is a partial cross-sectional view showing a structure of the electroconductive part in the socket of FIG. 1.

The wiring pattern structure and the cross-sectional structure of the electroconductive film 34 are shown in detail in FIGS. 4 through 6. As is shown in FIGS. 4 and 6, the various electroconductive films 34 are covered by an insulating film 36 such as a polyimide on the side of the insulating film 32 opposite to the side adjacent IC ship 60 extending generally radially from the center of the film toward the outer peripheral part of the film.

As is shown in FIGS. 5 and 6, moreover, each electroconductive film 34 has a protrusion or bump 34 that protrudes or rises to the upper surface of the film through a hole 32b in the insulating film 32 at a location conforming to each bump BP of the IC chip in the neighborhood of the center of the film. This bump 34a forms the first contact part for an electric connection with each corresponding bump BP of IC chip 60. It may be desirable that gold plating be effected on the surface of the elevated part 34a.

As is shown in FIGS. 4 and 6, further, each electroconductive film 34 is exposed as a pad 34b through insulating film 36 at a prescribed location in the neighborhood of the outer peripheral part of the film at a location conforming to a contact part 50d of a socket terminal 50 which will be described in greater detail later. This pad part 34b forms a second contact part for an electric connection with each corresponding socket terminal 50.

As is shown in FIG. 4, there are provided a pair of round openings 32a on both end faces of insulating film 32 for the passing of the aforementioned pair of positioning pins 30.

As is shown in FIG. 2, a deformable rubber plate 38, an intermediate support plate 40 and an inner base 42 are positioned like layers in that order between the lower side of the insulating film 32 and bottom surface of external base 10. Additionally, between the intermediate support plate 40 and the inner base 42, a plurality of compressive coil springs 44 are provided for supporting the intermediate support plate 40 in a horizontal position.

Figure 3:
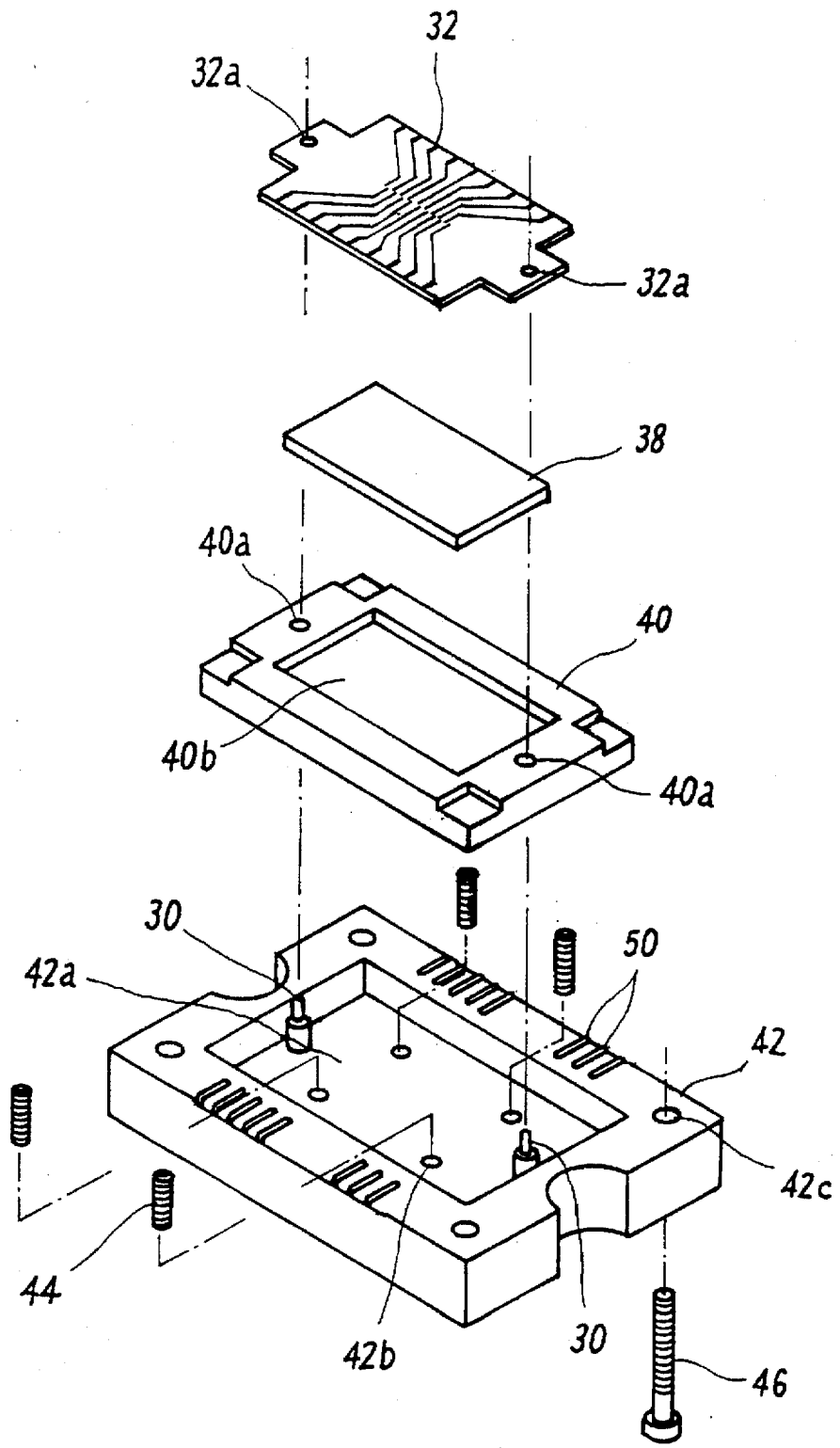
FIG. 3 is an exploded figure showing a wiring pattern of an electroconductive part in the socket of FIG. 1.

As is shown in FIG. 3, the inner base 42, the intermediate support plate 40, the rubber plate 38 and the insulating film 32 are assembled integrally. On the upper surface of the inner base 42, a cavity 42a is formed at the bottom on which the aforementioned pair of positioning pins 30 are mounted. Further, a plurality of reeling holes 42b are provided for receiving the lower end of the plurality of compressive coil springs 44 with one coil spring in each reeling hole.

The intermediate support plate 40 is placed and supported on the compressive coil springs 44 with the respective positioning pins 30 being inserted into a pair of pin passing holes 40a that have been provided at both ends of plate 40. On the upper surface of the intermediate support plate 40, a comparatively shallow cavity 40b is formed and rubber plate 38 is held in this cavity 40b in such a way that its top is typically exposed above the wall forming the shallow cavity.

Lastly, the insulating film 22 is installed in such a fashion that the respective positioning pins 30 are injected in a pair of pin passing holes 32a at both ends thereof so that the film center is placed on the rubber plate 38 and the film periphery in the longitudinal direction is placed on the peripheral part of the upper surface in the longitudinal direction of the inner base 42.

Bolt passing holes 42c are provided at the four corners of the inner base 42 and, as bolts 46 are screwed to spiral holes (not shown in the drawings) on the side of the external base 10 through each bolt passing hole 42c, the inner base 42 and correspondingly the assembly shown in FIG. 3 are installed on the external base 10.

A large number of socket terminals 50 are arranged in a row at a pitch corresponding to the pitch of the second contact part of the electroconductive film 34 on the side edges of cavity 42a in the inner base 42.

As is shown in FIG. 2, socket terminals 50 comprise a horizontal spring part 50a which extends approximately horizontally at the peripheral part of the upper surface of the inner base 42, a first contact part 50b which is formed in such a way as to protrude upward toward the top surface of base 10 at the inner end of the horizontal spring part 20a adjacent inner base 42, an engaging part 50c that has been formed on the outer end of the horizontal spring part 50a, an arc spring part 50d which extends downwardly in a curve from the inside of the horizontal spring part 50a and a second contact part 50e that extends upward from the tip of the arc spring part 50d.

From the elastic force of the displacement of horizontal spring part 50a and arc spring part 50d, the first contact part 50b compressively contacts the second contact part 34b of each corresponding electroconductive part 34 and the second contact part 50e is in compressive contact with each corresponding contact pad on the substrate 70.

Since the engaging part 50c is engaged to a groove 42e that has been provided on the periphery of the upper surface of the inner base 42, the socket terminals as a whole are held at the prescribed location. Inasmuch as the peripheral part in the longitudinal direction of the insulating film 32 is held on the bottom side of the external base 10, a stable electric connection is guaranteed between the second contact part 34b of each electroconductive film 34 on the insulating film 32 and each socket terminal 50. In the inner base 42, a partition wall 52 is provided for the prevention of mutual contact between the adjacent socket terminals 50.

As is shown in FIGS. 1 and 2, moreover, a protuberant outer frame 10d is formed on the periphery of the upper surface of the cavity 10b of the external base 10. Further, a sponge-like dust seal 54 is provided at a position corresponding to the said outer frame 10d on the inner side of the cover 12 so that as the cover 12 is closed, the outer frame 10d of the base 10 is covered with a dust seal 54 thereby tightly sealing cavity 10b from dust.

Still further on the inner side of the cover 12, a holding pad 56 is provided for pressing a carrier 62 that has been inserted into the base concave 10b in a direction toward the bottom of the cavity. The surface or the holding face of this holding pad 56 is curved so that when the cover 12 is closed, this curved holding face presses the center of the upper surface of the carrier 62 between positioning pins 30 approximately in the state of a linear contact, with a consequence that IC chip 60 which is being held by the carrier 62 is pressed to the insulating film 32 with uniform pressure.

The operation of the socket and actions of various parts thereof at the time when an IC chip 60 is mounted will be further explained below.

At the time when the IC chip 60 is not mounted, the base cavity 10b is vacant and no load is applied to the insulating film 32. As has been described above, the IC chip 60 is inserted into the base cavity 10b with the mounting surface 60a with the bumps BP facing down and the back being held by the carrier 62. As the positioning pin 30 on the side of the base is inserted into the pin passing hole 62a of the carrier 62, the IC chip 60 is placed on the insulating film 32 in the state of being positioned in the base cavity 10b with the various contacting bumps BPs contacting the first contact part 34a of the corresponding electroconductive films 34.

As is shown in FIG. 2 as the cover 12 is closed and latch 24 engages base 10, the holding pad 56 of the cover 12 covers the carrier 62 thereby pressing the IC chip 60 downward toward the bottom of base cavity 10b. The compressive force from this holding pad 56 is additive to the upward force of compressive coil spring 44 through the insulating film 32, the rubber plate 38 and intermediate support plate 40.

The compressive coil springs 44 are compressively deformed and because of the elastic force thereof, the IC chip 60 and the insulating film 32 contact each other with the added pressure so that electric connection is obtained between each bump BP and the first contact part 34a of each first electroconductive part 34.

Since the second contact part 34b of the electroconductive film 34 is regularly in contact with the socket terminal 50, each bump BP is then connected to the prescribed pad on the print substrate 70 through the electroconductive film 34 and the socket terminal 50 and eventually comes to an electric connection with an inspection device through the print wiring on the substrate 70. The IC chip 60 is now ready to receive a test such as the burn-in test.

In order to remove the IC chip 60 from this socket, the latch 24 is moved to the release position and the cover 12 is opened. The carrier 62 can then be picked by a tool such as a pair of tweezers, etc., out of the base concave 10b. When the IC chip 60 is to be extracted from the carrier 62, the IC chip 60 is pushed by some suitable tool through the opening 62b from the reverse side of the carrier 62 followed by the peeling of the adhesive agent holding the chip to the carrier. In the case where the carrier 62 has been adhered to IC chip 60 by certain prescribed transparent or semi-transparent substances, the adhesive agent may be peeled by applying an ultra-violet ray from the reverse side.

As has been described above, when the IC chip 60 is placed in a carrier 62, and the mounting surface 60a contacts the surface of the insulating film 32 that has been arranged at the bottom of the cavity 10b of the base and the cover 12 is closed and pressed from above on the bottom of the socket, the insulating film 32 is displaced downward integrally with the rubber plate 38 and the intermediate support plate 40 in opposition to the compressive coiled spring 44. This action results in reliable electrical connection between each bump BP of the IC chip 60 and each electroconductive film part 34 on the insulating film 32, and ultimately between each bump BP and each socket terminal 50 in the base. The variations in the bumps BP and other dimensional differences are absorbed by the compressive coil springs 44 and the rubber plate 38. In this design the socket terminals do not directly contact the terminal bumps on the chip.

The electroconductive film 34 according to this embodiment is pattern-formed on the insulating film 32 by such means as etching or the like, and is arranged and positioned on the socket base to be integral with the insulating film 32. Accordingly, the socket assembling operation is extremely simple and can be completed in a short period of time.

In addition, the electroconductive film 34 can be made with various wire patterns on the insulating film 32. It is especially possible to arrange the first contact part 34a at a narrow pitch corresponding to the bumps BP and the second contact part 34b at a wider pitch. This allows for further spacing between terminals 50 so as to cope with narrowing of the pitch in many new chip designs.

Also, in view of the fact that the insulating film 34 is coated with an insulating film 36 in the areas other than the contact parts 34a and 34b, there is no danger of short circuiting even if an electroconductive substance should adhere on the surface between the adjoining electroconductive films 34.

In accordance with this embodiment, the IC chip 60 has the bumps BP arranged in one vertical row at the center of the mounting surface 60a. Such a pattern of bump arrangement is merely used as an example. Other arrangement patterns could also be used.

Still further, since the socket terminals 50 that are in contact with the second contact parts 34b of the electroconductive film 34 are generally fixed in the inner base 42 without being displaced during mounting of the IC chip, the terminals do not require a clearance for displacement. Even when the pitch of the socket terminals 50 is quite narrow, there only needs to be spacing room for the thickness of the partition wall 52.

Also, in accordance with the invention, the support plate that is arranged between the insulating film 32 and the compressive coil springs 44 comprises a rubber plate 38, and the rubber plate 38 supplements the elasticity of the compressive coil springs 44. If necessary, it is possible to replace the rubber plate 38 with a rigid plate made of a metal or a resin, etc.

Further, in accordance with this invention, the elastic member that is placed between the intermediate support plate 40 and the inner base 42 typically uses a plurality of compressive coil springs 44. However, another suitable elastic member such as, for example, a plate spring or the like may also be employed.

Figure 8:
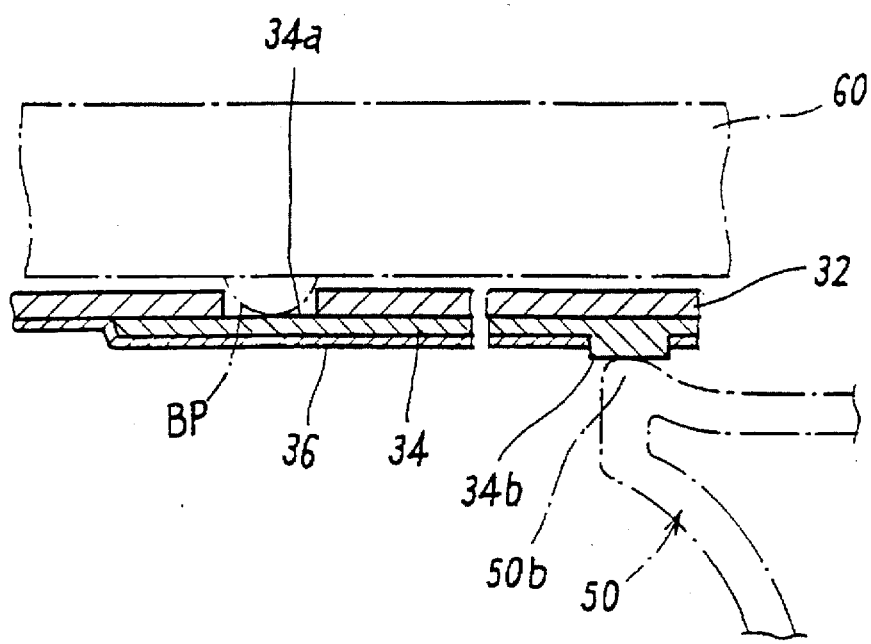
FIG. 8 is a cross-sectional view showing a variation in the contact system in the socket of FIG. 1.

Still further, in accordance with the invention, the first contact part 34a of the electroconductive film 34 is formed as a protuberance or bump on the insulating film 32. However, as is shown in FIG. 8, it is possible to form the first contact part 34a by providing a "cut out" or concavity in the insulating film 32 with a protuberant bump BP being brought into contact with the first contact part 34a through the cut out. Also as is shown in FIG. 9, a concave-shaped contact part BP may be used with the first contact part 34a which is in the form of a protrusion being brought into contact with such contact part BP.

Figure 9:
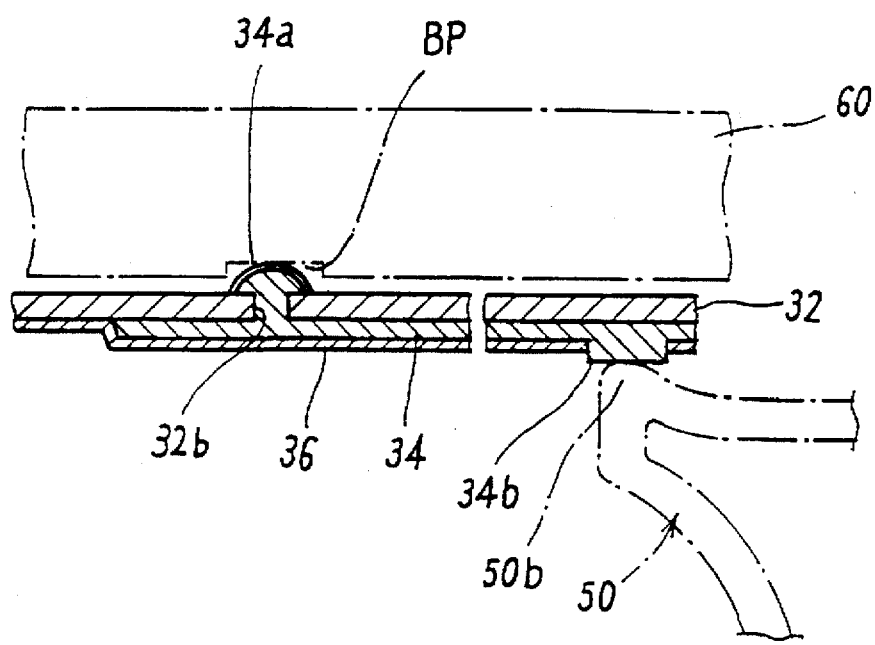
FIG. 9 is a cross-sectional view showing another variation in the contact system in the socket of FIG. 1.

In using the contacting arrangement as shown in FIGS. 8 and 9, the IC chip 60 is positioned by the insertion and direct contact between each corresponding bump/contact part BP and the first contact part 34a of the electroconductive film 34 so that it is possible to not use carrier 62.

The socket in the aforementioned embodiment can be used for testing electric parts other than IC chips which do not have external lead terminals.

Figure 10:
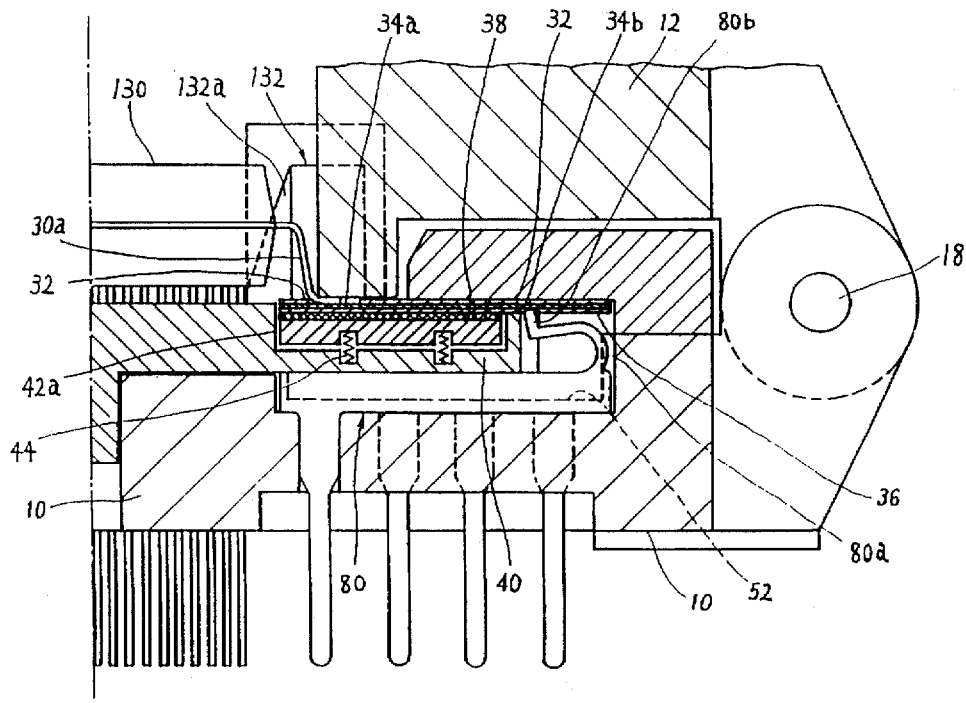
FIG. 10 is a cross-sectional view the construction of the essential part of the socket for IC package mounting according to a second embodiment of this invention.
Figure 11:
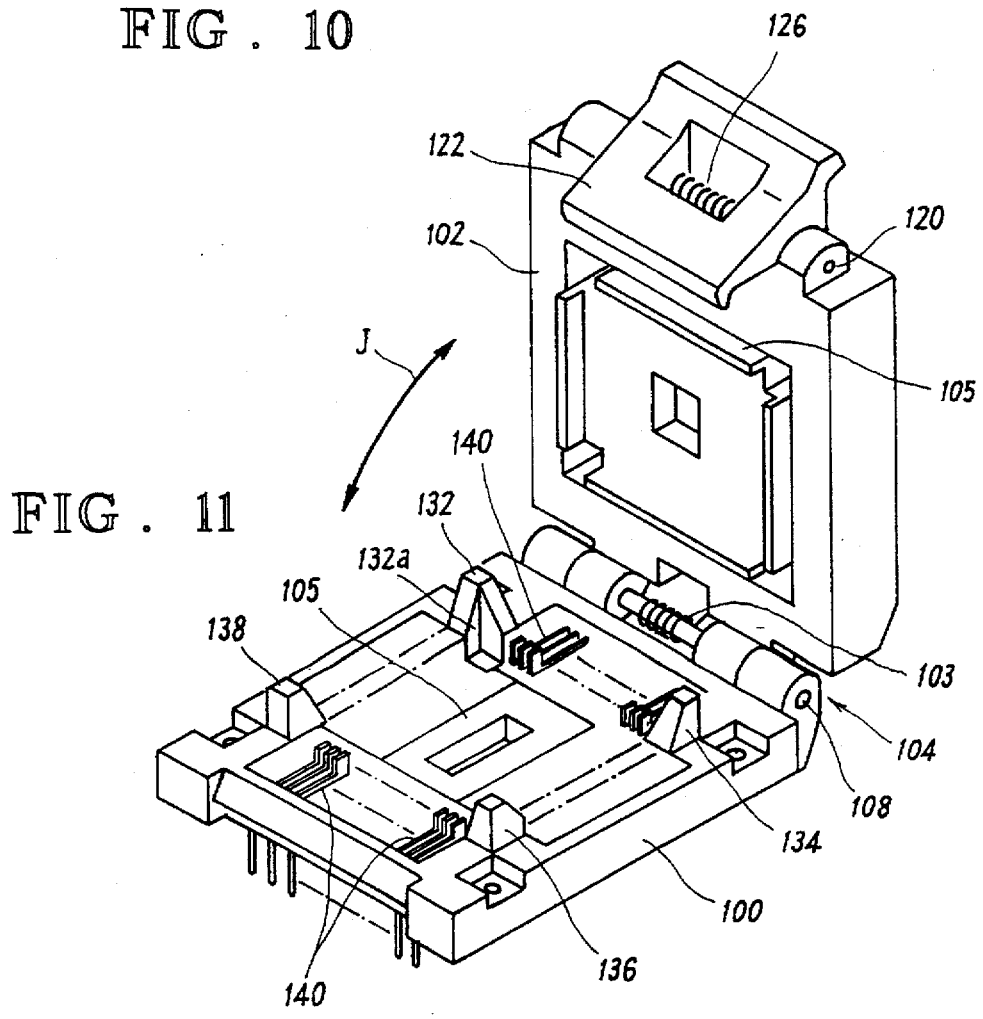
FIG. 11 is an oblique view showing a socket according to the prior art.
Figure 12:
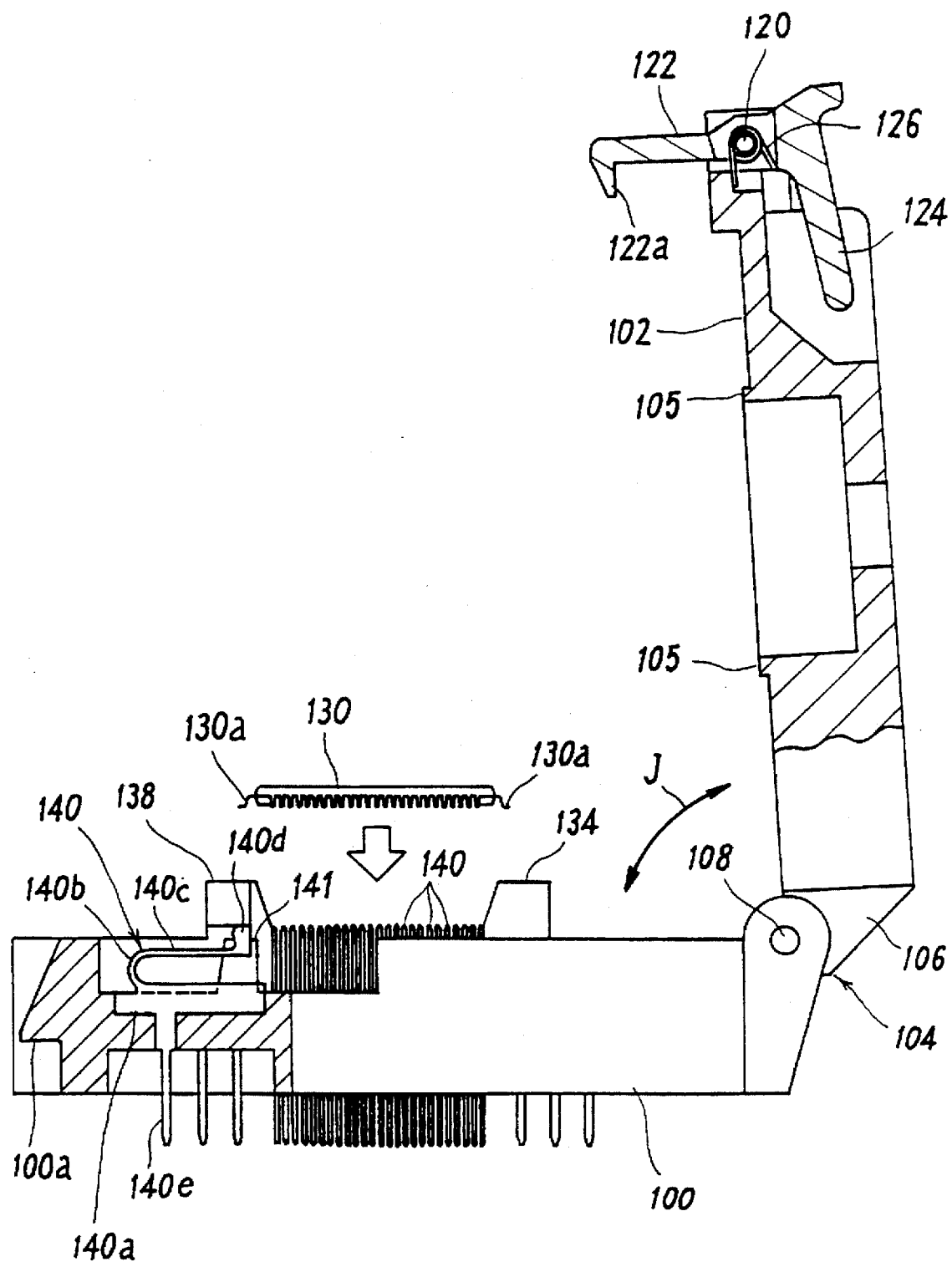
FIG. 12 is a cross-sectional view of the socket according to FIG. 11.

Also, this invention can be used with an electric part having external lead terminals such as a standard IC package as is shown in FIG. 10. In describing this second embodiment, the parts which are common with the conventional socket shown in FIGS. 11 and 12 are given the same codes as in FIGS. 11 and 12; and the parts which are common with the socket in the aforementioned first example are given the same codes as in FIGS. 1 through 9. In this socket, the socket terminal 80 has the same construction as the contact 140 in the conventional socket shown in FIGS. 11 and 12. Functionally, however, it corresponds to the socket terminal 50 in the socket described in the aforementioned first embodiment. In other words, the first contact part 80b that has been formed at the upper edge of the arc spring part 80a of the socket terminal 80 is so constructed so as to compressively contact the second contact part 34b of the electroconductive film 34 on the side of the insulating film 32 by the elasticity due to the deformation of the arc spring part 80a.

It is to be understood that the socket of this invention can be used not only in the burn-in test but also in the electric property test for an examination of the input-output characteristics or pulse characteristics of an electric part for a short period of time. In such a case, the cover or the latch mechanism is not required. It is only necessary to press the electric part by a suitable tool downwardly in cavity 10b.

According to the socket of this invention which has been explained above, an insulating substrate is arranged at a position for receiving an electric part inside the main socket body. This insulating substrate is elastically supported by an elastic member through a support plate wherein an electroconductive means is provided in a desired wiring pattern on the insulating substrate. The connective terminal part of the electric part is made to contact under added pressure a first contact part of the electroconductive part; and at the same time, the socket terminal part is connected to a second contact part of the electroconductive part, thereby obtaining an electric connection between the connective terminal part of the electric part and the socket terminal part through the electroconductive part. In such a design, no terminal member displacement is required, assembly of the socket is easy and the insertion of electrical parts to be tested is simple; and electrical parts with increased number of pins with a narrowing of the pitch and no external lead terminals can be easily accommodated.

This invention has been described above with reference to specific embodiments; however, it is intended to embrace all such alternative, modifications and variations as fall within the spirit and scope of the appended claims.

I claim:

1. A socket for mounting an electrical part in a freely detachable manner in which the electrical part has a body portion with a plurality of connective terminal parts with a prescribed pitch between the parts comprising a main socket body for receiving the electrical part, a socket terminal means fixed in the socket body which is stationary during mounting and dismounting of the electrical part, a plurality of electroconductive parts on an insulating substrate mounted on a spring biased support means in the socket body, each of the electroconductive parts having first and second contact means with said first contact means of said electroconductive parts having the same pitch as the pitch between said connective terminal parts, the first contact means for electrically connecting with one of the connective terminal parts of the electrical part and the second contact means for electrically connecting with the socket terminal means thereby providing electrical connection between the electrical part and the socket and a holding means comprising a cover with a hold member for holding the plurality of connective terminal parts in contact with the first contact means of the plurality of electroconductive parts when the electrical part is mounted on the socket.

2. A socket according to claim 1 wherein said cover is attached to said socket body movable between an open and a closed position with respect to said socket body.

3. A socket according to claim 2 wherein said cover further includes a dust seal member which engages the socket body around the periphery of said body when in the closed position to seal the area of said first and second contact means from dust.

4. A socket according to claim 1 wherein said socket terminal means comprises a plurality of socket terminal parts of the same pitch as between the plurality of connective terminal parts so as to provide one terminal part in the socket for every one connective terminal part.

5. A socket according to claim 1 wherein said insulating substrate contains a plurality of cut-out areas defining the first contact means of the electroconductive parts.

6. A socket according to claim 1 wherein said spring biased support means is mounted to said socket body in a central cavity contained therein.

7. A socket for mounting a bare integrated circuit (IC) chip without external extension leads in a freely detachable manner in which the IC chip has a body portion with a plurality of connective terminal parts thereon with a prescribed narrow pitch between the parts comprising a main socket body for receiving the IC chip, a socket terminal means fixed in the socket body which is stationary during mounting and dismounting of the IC chip, a plurality of electroconductive parts on one surface of an insulating substrate positioned in said socket body for receiving said IC chip with an insulating means generally covering the plurality of electroconductive parts on the surface opposite the surface in contact with the insulating substrate, said insulating substrate containing a plurality of cut-out areas defining a first contact means of the electroconductive parts and said insulating means containing a plurality of cut-out areas defining a second contact means of the electroconductive parts, a support means in said socket body for elastically supporting said insulating substrate, said first contact means of said electroconductive parts having the same pitch as the pitch between said connective terminal parts for one to one contacting, the first contact means for electrically connecting with one of the connective terminal parts of the IC chip and the second contact means for electrically connecting with the socket terminal means thereby providing complete electrical connection between the IC chip and the socket and a holding means for holding the plurality of connective terminal parts in contact with the first contact means of the plurality of electroconductive parts when the IC chip is mounted on the socket.

8. A socket according to claim 7 wherein said holding means is a cover attached to said socket body movable between an open and a closed position with respect to said socket body.

9. A socket according to claim 8 wherein said cover further includes a hold pad contained in the cover and positioned for biasing said connective terminal parts in contact with the first contact means of the plurality of the electroconductive parts when said cover is in the closed position.

10. A socket according to claim 8 wherein said cover further includes a dust seal member which engages the socket body around the periphery of said body when in the closed position to seal the area of said first and second contact means from dust.

11. A socket according to claim 7 wherein said socket terminal means comprises a plurality of socket material parts of the same pitch as between the plurality of connective terminal parts so as to provide one terminal part in the socket for every one connective terminal part.

12. A socket according to claim 7 wherein said support means comprises an inner base and an intermediate support plate with a spring means positioned therebetween.

13. A socket according to claim 12 further including a deformable elastomer member on said intermediate support means adjacent said insulating substrate for improving contacting reliability.

14. A socket according to claim 12 wherein said support means is mounted to said socket body in a central cavity contained therein.

15. A socket for mounting an electrical part in a freely detachable manner in which the electrical part has a body portion with a plurality of connective terminal parts with a prescribed pitch between the parts comprising a main socket body for receiving the electrical part, a socket terminal means fixed in the socket body which is stationary during mounting and dismounting of the electrical part, a plurality of electroconductive parts on an insulating substrate mounted on a spring biased support means in the socket body, each of the electroconductive parts having first and second contact means with said first contact means of said electroconductive parts having the same pitch as the pitch between said connective terminal parts, the first contact means for electrically connecting with one of the connective terminal parts of the electrical part and the second contact means for electrically connecting with the socket terminal means thereby providing electrical connection between the electrical part and the socket, an insulating means generally covering the plurality of the electroconductive parts on the surface opposite the surface in contact with the insulating substrate, said insulating substrate containing a plurality of cut-out areas defining the first contact means of the electroconductive parts and said insulating means containing a plurality of cut-out areas defining the second contact means of the electroconductive parts, and a holding means for holding the plurality of connective terminal parts in contact with the first contact means of the plurality of electroconductive parts when the electrical part is mounted on the socket.

16. A socket for mounting an electrical part in a freely detachable manner in which the electrical part has a body portion with a plurality of connective terminal parts with a prescribed pitch between the parts comprising a main socket body for receiving the electrical part, a socket terminal means fixed in the socket body which is stationary during mounting and dismounting of the electrical part, a plurality of electroconductive parts on an insulating substrate mounted on a spring biased support means comprising an inner base and an intermediate support plate with a spring means positioned therebetween in the socket body, each of the electroconductive parts having first and second contact means with said first contact means of said electroconductive parts having the same pitch as the pitch between said connective terminal parts, the first contact means for electrically connecting with one of the connective terminal parts of the electrical part and the second contact means for electrically connecting with the socket terminal means thereby providing electrical connection between the electrical part and the socket and a holding means for holding the plurality of connective terminal parts in contact with the first contact means of the plurality of electroconductive parts when the electrical part is mounted on the socket.

17. A socket according to claim 16 wherein said spring means are a plurality of coil springs.

18. A socket according to claim 16 further including a deformable elastomer member on said intermediate support means adjacent said insulating substrate for improving contacting reliability.

* * * * *